United States Patent
Bannick et al.

(10) Patent No.: US 11,968,793 B1
(45) Date of Patent: Apr. 23, 2024

(54) INSULATING ENCLOSURE WITH A CONDUCTIVE LINER

(71) Applicant: Lunar Energy, Inc., Mountain View, CA (US)

(72) Inventors: Stephen Robert Bannick, San Francisco, CA (US); Peter H. J. How, Honolulu, HI (US); Charles Ingalz, San Jose, CA (US); Christopher Breckenridge Todd, Jackson, WY (US); Mark Daniel Goldman, Los Altos Hills, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/484,281

(22) Filed: Oct. 10, 2023

Related U.S. Application Data

(60) Provisional application No. 63/415,116, filed on Oct. 11, 2022.

(51) Int. Cl.
   *H05K 5/02* (2006.01)
(52) U.S. Cl.
   CPC .................................. *H05K 5/0247* (2013.01)
(58) Field of Classification Search
   None
   See application file for complete search history.

(56) References Cited

U.S. PATENT DOCUMENTS

| | | | | |
|---|---|---|---|---|
| 6,912,123 | B2 * | 6/2005 | Sakai | H02J 9/06 307/64 |
| 7,450,388 | B2 * | 11/2008 | Beihoff | B60L 50/15 361/679.48 |
| 7,910,834 | B2 * | 3/2011 | McGinley | H02J 7/0042 174/112 |
| 9,974,201 | B1 * | 5/2018 | Schutten | H05K 1/0243 |
| 10,284,106 | B1 * | 5/2019 | Vinciarelli | H02M 7/003 |
| 11,508,727 | B2 * | 11/2022 | Wan | H01L 27/1022 |
| 2018/0048244 | A1 * | 2/2018 | Jacobson | H05K 5/0247 |
| 2021/0408773 | A1 * | 12/2021 | Brar | B60L 53/30 |

* cited by examiner

*Primary Examiner* — Xanthia C Relford
(74) *Attorney, Agent, or Firm* — Van Pelt, Yi & James LLP

(57) ABSTRACT

An insulating enclosure is disclosed, including: an opening in a side of the insulating enclosure, wherein the opening provides a conductor within a conduit passage into an interior of the insulating enclosure, wherein the conductor is to carry current from the inverter module, wherein a conductive sheath of the conduit is mechanically connected to the insulating enclosure via the opening; and a conductive liner, wherein the conductive liner provides a ground plane for components within the insulating enclosure, wherein the conductive liner covers at least a portion of the side of the insulating enclosure, and wherein the conductive liner is electrically connected to the conductive sheath of the conduit.

17 Claims, 5 Drawing Sheets

INSULATING ENCLOSURE WITH A CONDUCTIVE LINER

CROSS REFERENCE TO OTHER APPLICATIONS

This application claims priority to U.S. Provisional Patent Application No. 63/415,116 entitled INTEGRATED GROUNDSHEET filed Oct. 11, 2022 which is incorporated herein by reference for all purposes.

BACKGROUND OF THE INVENTION

Some manufacturers of conduits require a conduit entry into a housing to be non-conductive (e.g., plastic). As such, a separate ground wire would need to be installed into the non-conductive housing for each conduit entry. However, the installation of the ground wire for each conduit entry into the housing is very space inefficient and unwieldy, especially when there is a dense number of components already inside the housing. An alternative to installing a ground wire for each conduit entry into the non-conductive housing is to use a conductive housing (e.g., made of metal). However, it is very expensive to manufacture a housing from conductive material such as aluminum.

BRIEF DESCRIPTION OF THE DRAWINGS

Various embodiments of the invention are disclosed in the following detailed description and the accompanying drawings.

DETAILED DESCRIPTION

Figure 1:
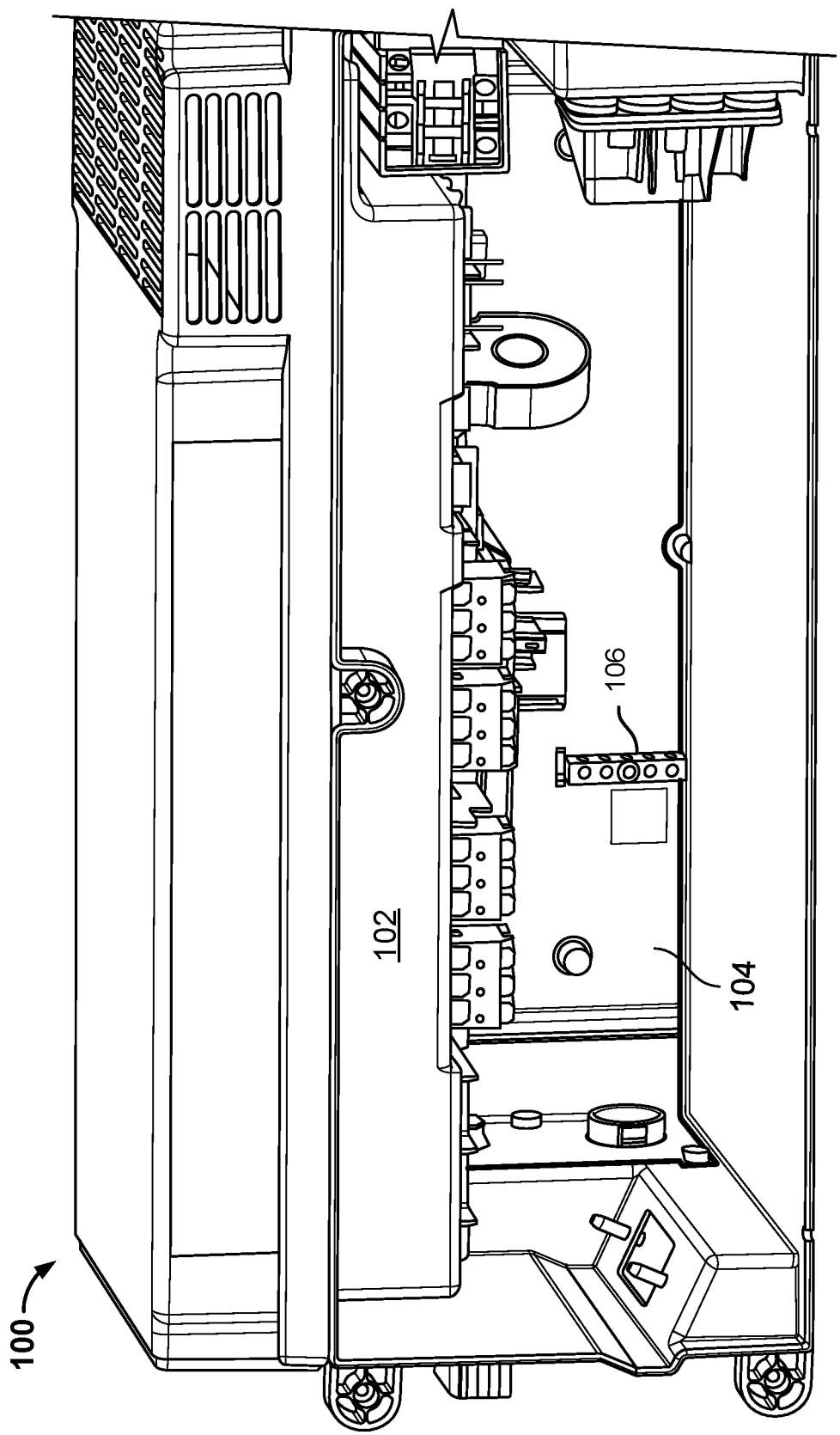
FIG. 1 is a diagram that shows the interior of an insulating enclosure with a conductive liner.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of an insulating enclosure with a conductive liner are described herein. The insulating enclosure (e.g., housing) comprises a plurality of sides. The insulating enclosure comprises at least an inverter module that is mounted on the interior of the insulating enclosure. In various embodiments, the inverter module comprises a circuit board with electronic components that are configured to convert direct current (DC) into alternative current (AC). The insulating enclosure comprises at least an opening through a side that provides passage to a conduit. For example, there are at least two conduits that pass through respective openings through one or more sides of the insulating enclosure and where each conduit provides either the DC from a DC source to the inverter module or AC that is output from the inverter module. The insulating enclosure further comprises a conductive liner that is closely fitted against at least one side of the interior of the insulating enclosure. The conductive liner provides a ground plane for components within the insulating enclosure. The conductive liner is electrically connected to a conductive sheath (e.g., pipe) of the conduit when the conductive sheath is mechanically connected to the insulating enclosure. In some embodiments, the conductive sheath of the conduit is electrically connected to the conductive liner via a conductive conduit fitting.

FIG. 1 is a diagram that shows the interior of an insulating enclosure with a conductive liner. The diagram shows insulating enclosure 100 (e.g., a housing) with one side removed such that the interior of insulating enclosure 100 is visible. As shown in FIG. 1, the interior of insulating enclosure 100 includes at least inverter module 102 and conductive liner 104. Inverter module 102 comprises a cover over a circuit board (not shown) that includes electronic components that are configured to convert DC to AC. Conductive liner 104 lines/is closely fitted against a portion of the interior of insulating enclosure 100. In some embodiments, conductive liner 104 lines/is closely fitted against each surface/wall within insulating enclosure 100 that includes at least one conduit entry point/opening. Insulating enclosure 100 is made of an electrically insulating material (e.g., plastic) while conductive liner 104 is made of an electrically conductive material (e.g., aluminum, steel, or copper), for example, and is installed close along portions of at least two inner walls/surfaces of insulating enclosure 100. In the example shown in FIG. 1, conductive liner 104 substantially covers a first, length-wise interior wall and extends over respective portions of a second and a third width-wise interior wall of insulating enclosure 100.

Conductive liner 104 is coupled to conductive service ground element 106, which is then coupled to a protective earth conductor (not shown in FIG. 1). As will be described in further detail below, openings that are made as entry points for conduits (or other elements that need to be inserted into the electrical box) can be made through both insulating enclosure 100 and the corresponding area of conductive liner 104. A conductive conduit fitting is inserted into a conduit opening and secured against conductive liner 104 on the interior of insulating enclosure 100. A conduit with a conductive exterior/sheath/pipe (not shown in FIG. 1) is inserted into the conduit fitting from the exterior of insulating enclosure 100 and as a result, a secure ground connection would be established between the conduit and conductive liner 104 by virtue of securing the conduit to the conductive conduit fitting, which has already been secured against conductive liner 104. This is because any current that flows along the ground/conductive sheath of the conduit can flow along conductive liner 104, to conductive service ground element 106, and to the protective earth ground, which will prevent an unsafe amount of undesirable current transmission through another conductor (e.g., through a human).

As such, adding a conductive sheet/liner in an otherwise non-conductive enclosure effectively renders the lined/covered portion of the enclosure itself conductive but manufacturing and cutting the conductive sheet/liner is far more cost effective than manufacturing/tooling the entire enclosure out of a conductive material (e.g., metal).

Figure 2:
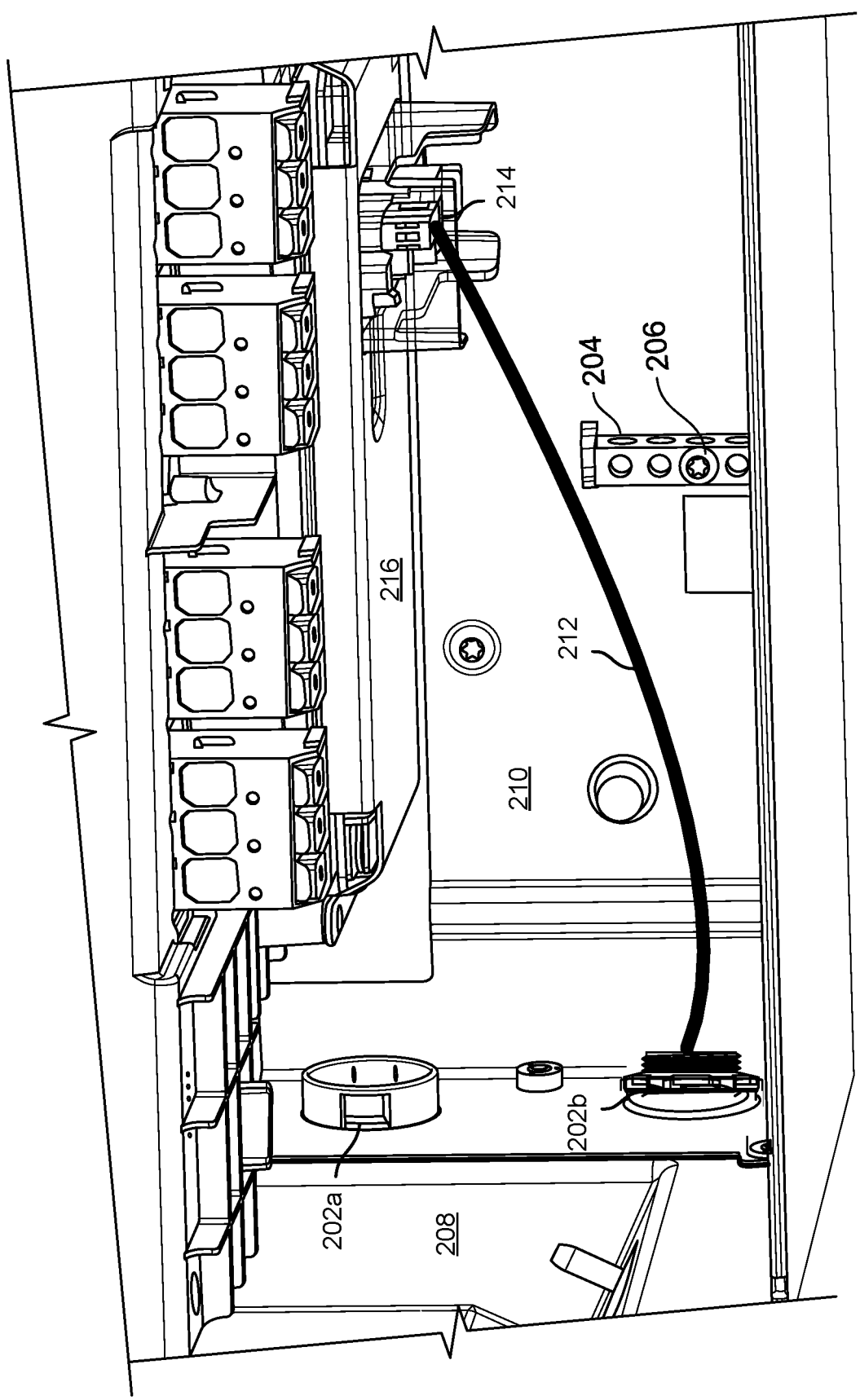
FIG. 2 is a diagram showing an example of where conduit can be inserted through an insulating enclosure with a conductive liner.

FIG. 2 is a diagram showing an example of where conduit can be inserted through an insulating enclosure with a conductive liner. Openings (e.g., ports) 202a and 202b that are punched/drilled through insulating enclosure 208 and conductive liner 210 can be the entry points through which conduits are ultimately inserted into insulating enclosure 208. In FIG. 2, a plug has been placed inside opening 202a to prevent weather elements from entering the interior of insulating enclosure 208. The plug that is shown to be inside opening 202a is a placeholder that can eventually be replaced by a conductive conduit fitting that is to receive a conduit with a conductive sheath and where wire(s) included in the conduit can be inserted into the interior of insulating enclosure 208. In contrast to opening 202a of FIG. 2, the male thread of a conductive (e.g., metallic) conduit fitting has been inserted into opening 202b. The portion of the conductive conduit fitting that has been inserted into the interior of insulating enclosure 208 via opening 202b is in electrical connection/contact with conductive liner 210 due to being secured against conductive liner 210 (e.g., by a locknut on the conduit fitting). While not visible in FIG. 2, a conduit with a conductive (e.g., metallic) sheath is coupled/fastened into the conductive conduit fitting that has been inserted into opening 202b from the exterior of insulating enclosure 208. The conductors (e.g., wires) enclosed within this conduit, such as wire 212, can be pulled into the interior of insulating enclosure 208 and connected to terminal 214 of controller 216 of the inverter module. The conduit uses the conductive sheath as its ground path. Because the conductive sheath of the conduit is in electrical connection with the conductive conduit fitting within opening 202b, and the conductive conduit fitting is in electrical connection with conductive liner 210, the grounded current that would flow from the conductive sheath of the conduit would then flow through conductive liner 210, and then pass through conductive service ground element 204 (which is made of a conductive material like metal) towards the earth ground conductor (not shown). As such, ground is immediately established for any conductive material-encased conduit that is added into insulating enclosure 208 via a conductive conduit fitting in a conduit entry point by virtue of the conduit fitting's electrical connection with conductive liner 210.

As shown in FIG. 2, conductive service ground element 204 is fastened via fastener 206 (e.g., a screw) to conductive liner 210 covering an interior wall of insulating enclosure 208 using a screw. However, in other examples, conductive service ground element 204 can be fastened to conductive liner 210 covering an interior wall of insulating enclosure 208 via a fastener other than a screw. Also, in other examples, conductive service ground element 204 can be mounted not directly on conductive liner 210 covering an interior wall of insulating enclosure 208 but on a conductive cover of a module (e.g., controller 216) within the interior of insulating enclosure 208 that is electrically bonded/directly mounted on conductive liner 210, so that conductive service ground element 204 is still electrically bonded to conductive liner 210.

In some embodiments, conductive liner 210 and insulating enclosure 208 are thin enough that if an existing conduit opening (e.g., 202a or 202b) needs to be expanded to a larger sized opening, the opening can still serve the same purpose of providing passaging to a conduit and/or the wire(s) within. For example, a drill can be used to drill through (e.g., plastic) insulating enclosure 208 and (e.g., aluminum) conductive liner 210 to create a new conduit opening or expand an existing one.

In various embodiments, conductive liner 210 covers at least a portion of each interior side/wall of insulating enclosure 208 that includes an opening for a respective conduit. In some embodiments, conductive liner 210 covers at least two interior sides/walls of insulating enclosure 208. Not only does conductive liner 210 provide an electrical grounding path for conduit inserted into the openings as well as other components within insulating enclosure 208, by lining and spanning substantially over the area of one or more of the (e.g., length-wise) interior sides/walls of insulating enclosure 208, conductive liner 210 also provides a mechanical stiffening feature for insulating enclosure 208. For example, conductive liner 210 provides stiffening for insulating enclosure 208 against impact to the exterior walls of insulating enclosure 208 and also provides stiffening for the structure of insulating enclosure 208 given that certain heavier modules (e.g., the inverter module) can be mounted at the ceiling of the interior of insulating enclosure 208.

Figure 3:
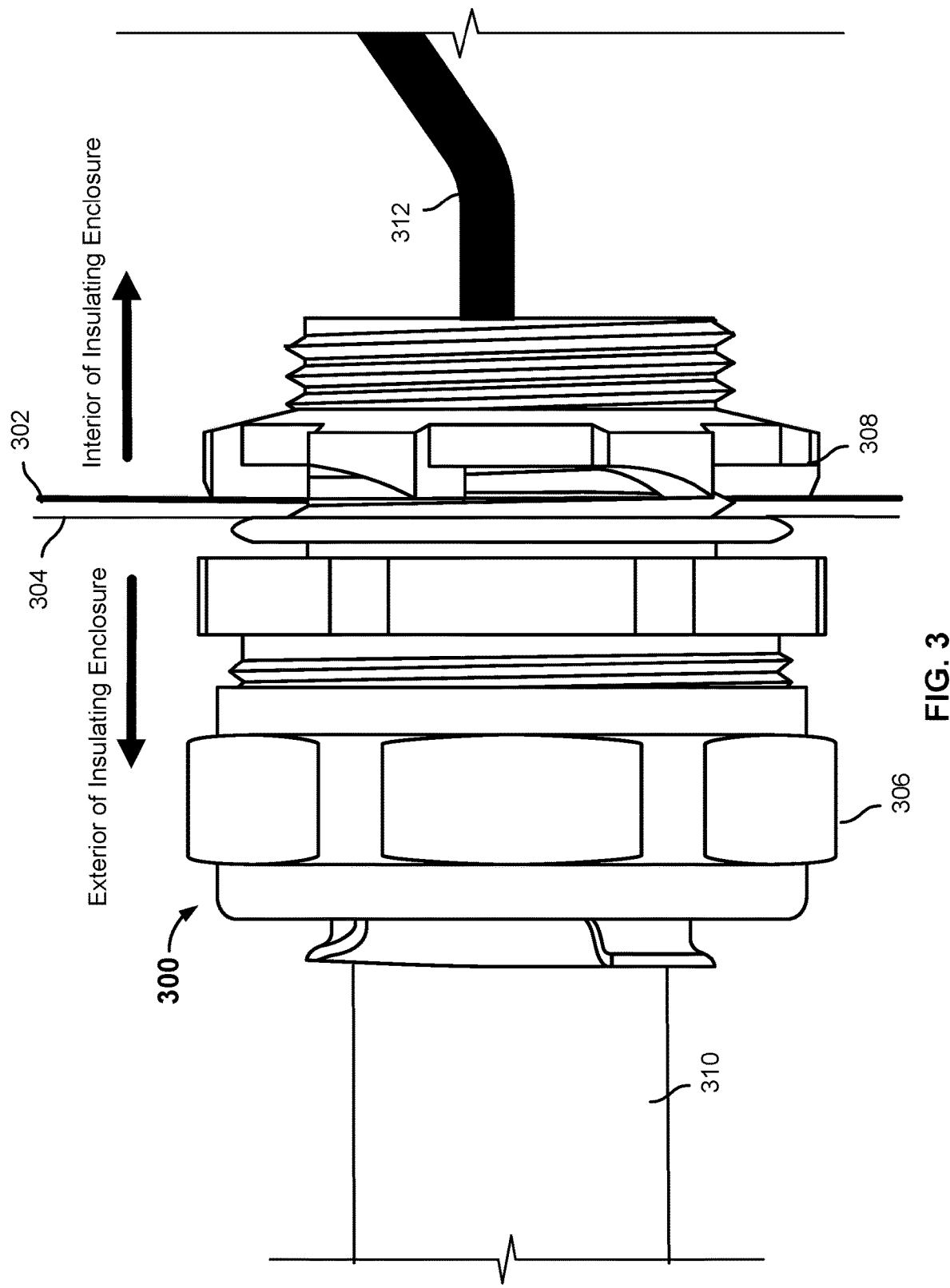
FIG. 3 is a diagram showing an example conductive conduit fitting that is to be inserted into an insulating enclosure.

FIG. 3 is a diagram showing an example conductive conduit fitting that is to be inserted into an insulating enclosure. In the example of FIG. 3, the male thread of conduit fitting 300, which is made of conductive (e.g., metallic) material, has already been inserted into an opening through a side of and a conductive liner against that side of an insulating enclosure. In FIG. 3, line 304 represents a cross-section of a side of an insulating enclosure and line 302 represents a cross-section of a conductive liner that covers that side. By being inserted into the opening through both a side of and a conductive liner that covers that side of an insulating enclosure, a first portion of conduit fitting 300 with locknut 308 is located in the interior of the insulating enclosure and a second portion of conduit fitting 300 with bushing 306 is located on the exterior of the insulating enclosure.

Prior to installing conduit fitting into an opening through insulating enclosure 304 and conductive liner 302, a plug that was inserted into the opening, if any, is first removed. Then, locknut 308, which is made of conductive material (e.g., metal), is unthreaded from the body of conduit fitting 300 so that the end of conduit fitting 300 can be inserted into the opening from the exterior into the interior of insulating enclosure 304. After conduit fitting 300 is partially inserted into the interior of insulating enclosure 304, locknut 308 is threaded back (reattached) onto conduit fitting 300 on the interior of the insulating enclosure to lock conduit fitting 300 against conductive liner 302 along the interior wall of insulating enclosure 304. Conduit 310 with a conductive (e.g., metallic) sheath is then inserted into the other end of conduit fitting 300 with bushing 306, which is located on the exterior of insulating enclosure 304. Bushing 306 can then be tightened (e.g., via turning) to mechanically couple/secure the inserted conduit to conduit fitting 300/insulating enclosure 304. After conduit fitting 300 is installed into the opening of insulating enclosure 304 as described above, one or more conductors (e.g., wires), such as wire 312, that are enclosed by conduit 310 can then pass through into the interior of the enclosure and become connected to appropriate terminals (e.g., on the inverter module) within the enclosure. For example, if the wires are connected to terminals on the inverter module, then one set of wire(s) could carry DC to input into the inverter module via a first conduit/conduit fitting that is passed through one opening and a second set of wire(s) could carry AC that is output from the inverter module via a second conduit/conduit fitting that is passed through a second opening.

As a result of the installation of conduit fitting 300 into an opening of the insulating enclosure as described above, the conductive sheath of conduit 310, which is also the ground path for conduit 310, is in electrical connection with conductive conduit fitting 300, which is in turn in electrical connection with conductive liner 302 on the interior of the insulating enclosure. As described above, because conductive liner 302 is in electrical connection with a ground element (not shown) within the interior of the insulating enclosure, conduit 310 is immediately properly grounded (e.g., in compliance with electrical codes of safety) once it has been fastened into conduit fitting 300. This design provides easy installation and grounding of conduits that are to be coupled to the insulating enclosure and avoids a need to manufacture the entire enclosure with a conductive material (which is a cost prohibitive option). Furthermore, this design obviates the need to separately clamp a ground wire within a conduit to a conductive nut with a special wire termination on the conduit fitting itself, which would be needed in an insulating enclosure that had no conductive liner.

Figure 4:
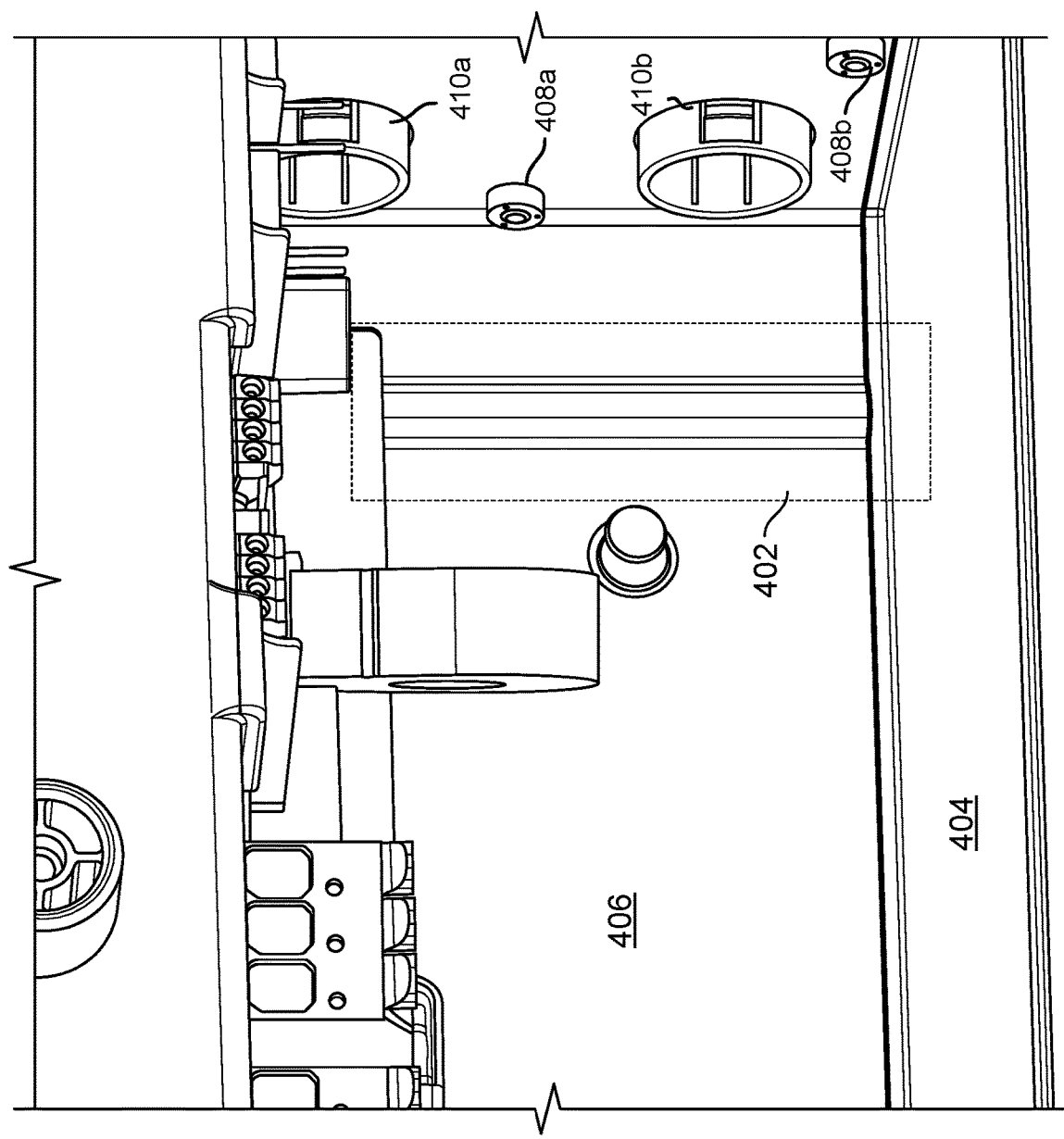
FIG. 4 is an example of a relief bend in the conductive liner.

FIG. 4 is an example of a relief bend in the conductive liner. Given that conductive liner 406 and insulating enclosure 404 are made of different materials (e.g., metal and plastic, respectively), each has a different coefficient of thermal expansion (CTE) and will therefore expand differently at different temperatures. Also, because insulating enclosure 404 houses electrical components that will generate heat, the ambient temperature inside the inverter box will increase when the components are in operation. As such, to compensate for the difference in thermal expansion for conductive liner 406 and insulating enclosure 404, which are connected together (e.g., via fasteners 408a/408b and openings 410b/410b for conduit fittings), a relief bend such as relief bend 402 is added to at least one portion of conductive liner 406. Relief bend 402 is a bend in the sheet of conductive liner 406 that provides a tolerance for conductive liner 406 to stretch with insulating enclosure 404 as insulating enclosure 404 thermally expands at a faster rate than the thermal expansion of conductive liner 406. Put another way, because insulating enclosure 404 is expected to expand more than conductive liner 406 in rising temperatures, relief bend 402 provides more area for conductive liner 406 to stretch out to accommodate the greater material expansion of insulating enclosure 404 such that neither insulating enclosure 404 nor conductive liner 406 tears, warps, or becomes detached from the other.

Figure 5:
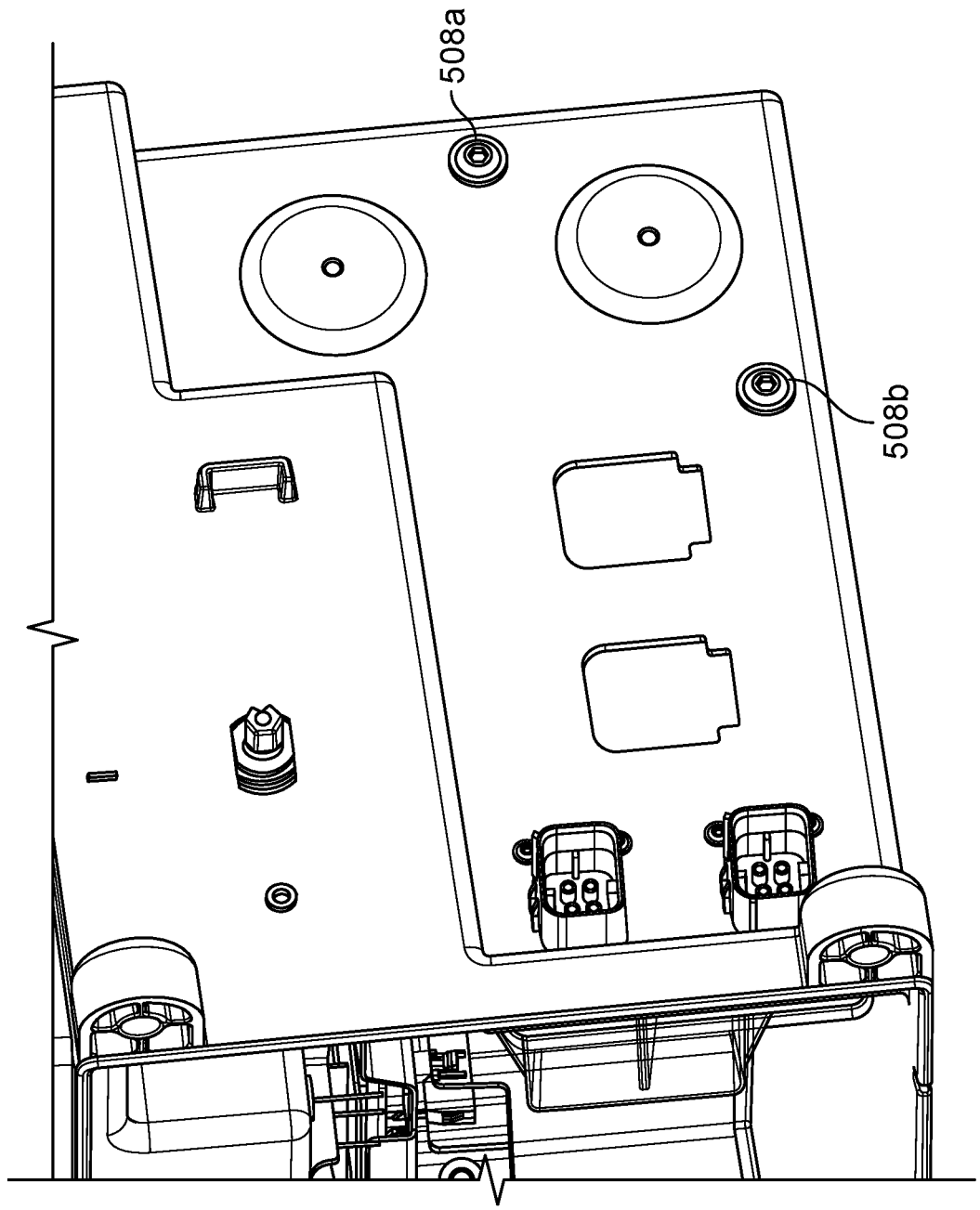
FIG. 5 is a diagram showing fasteners that couple the conductive liner to the insulating enclosure.

FIG. 5 is a diagram showing fasteners that couple the conductive liner to the insulating enclosure. FIG. 5 shows the exterior of the insulating enclosure and how the conductive liner can be coupled to the interior of the enclosure via fasteners such as screws 508a and 508b that are screwed in through-holes in both the enclosure and the conductive liner (not shown) on the interior of the insulating enclosure. The respective views of screws 508a and 508b on the interior of the insulating enclosure can be seen in FIG. 4 as fasteners 408a and 408b. As shown in the example of FIG. 5, screws 508a and 508b are located along a width-wise end of the insulating enclosure. In some embodiments, at least one fastener is used to couple the conductive liner and the interior wall of the insulating enclosure in a location that is proximate to the location of each conduit fitting opening through the conductive liner and the interior wall in order to hold the conduit fitting in place.

The conductive liner fitted against an insulating enclosure as described in various embodiments leverages all the benefits associated with an entirely conductive (e.g., metallic) enclosure but at a lower cost than it would take to manufacture the entire enclosure out of a conductive material (e.g., metal). The conductive liner fitted against an insulating enclosure as described in various embodiments also maintains the benefits (e.g., cost and flexibility of shape) of manufacturing an insulating (e.g., plastic) enclosure.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An insulating enclosure, comprising:
a plurality of sides;
an inverter module;
an opening in a side of the insulating enclosure, wherein the opening provides a conductor within a conduit passage into an interior of the insulating enclosure, wherein the conductor is to carry current from the inverter module, wherein a conductive sheath of the conduit is mechanically connected to the insulating enclosure via the opening; and
a conductive liner, wherein the conductive liner provides a ground plane for components within the insulating enclosure, wherein the conductive liner covers at least a portion of the side of the insulating enclosure, and wherein the conductive liner is electrically connected to the conductive sheath of the conduit.

2. The insulating enclosure of claim 1, wherein the opening comprises a first opening, wherein the side comprises a first side, wherein the conduit comprises a first conduit, wherein the conductor comprises a first conductor, wherein the conductive sheath comprises a first conductive sheath, and wherein the insulating enclosure further comprises a second opening in a second side of the insulating enclosure, wherein the second opening provides a second conductor within a second conduit passage into the interior of the insulating enclosure, wherein the second conductor is to carry current to the inverter module, wherein a second conductive sheath of the second conduit is mechanically connected to the insulating enclosure via the second opening.

3. The insulating enclosure of claim 2, wherein the first conductor is to carry alternating current (AC) from the inverter module and the second conductor is to carry direct current (DC) to the inverter module.

4. The insulating enclosure of claim 3, wherein the inverter module is configured to convert the DC into the AC.

5. The insulating enclosure of claim 1, further comprising a conductive conduit fitting inserted in the opening.

6. The insulating enclosure of claim 5, wherein the conductive liner is electrically connected to the conductive sheath of the conduit by a nut of the conduit fitting.

7. The insulating enclosure of claim 5, wherein the conductive sheath of the conduit is mechanically connected to the insulating enclosure via being secured to the conductive conduit fitting.

8. The insulating enclosure of claim 1, further comprising a conductive service ground element that is electrically connected to the conductive liner.

9. The insulating enclosure of claim 8, wherein the conductive service ground element is electrically connected to protective earth.

10. The insulating enclosure of claim 8, wherein the conductive service ground element is mounted on the conductive liner.

11. The insulating enclosure of claim 8, wherein the conductive service ground element is mounted on a component within the insulating enclosure that is electrically connected to the conductive liner.

12. The insulating enclosure of claim 1, wherein the side comprises a first side, and wherein the conductive liner substantially covers the first side on the interior of the insulating enclosure and extends over a portion of a second side of the insulating enclosure.

13. The insulating enclosure of claim 1, wherein the conductive liner is fastened to the side of the insulating enclosure.

14. The insulating enclosure of claim 1, wherein the conductive liner comprises a relief bend.

15. The insulating enclosure of claim 1, wherein the side of the insulating enclosure is made from plastic.

16. The insulating enclosure of claim 1, wherein the conductive liner is made from aluminum.

17. The insulating enclosure of claim 1, wherein the opening comprises a first opening in the side of the insulating enclosure, and wherein the conductive liner comprises a second opening that corresponds to the first opening of the side of the insulating enclosure.

* * * * *